United States Patent [19]

French

[11] 4,287,382
[45] Sep. 1, 1981

[54] SOLAR CELL ASSEMBLY AND FABRICATION OF SOLAR CELL PANELS UTILIZING SAME

[75] Inventor: Hollis E. French, North Chelmsford, Mass.

[73] Assignee: Exxon Research & Engineering Co., Florham Park, N.J.

[21] Appl. No.: 148,268

[22] Filed: May 9, 1980

[51] Int. Cl.³ .................... H01L 31/04; H01L 31/18
[52] U.S. Cl. ..................................... 136/244; 29/572; 136/251; 156/300; 156/308.2; 156/309.9; 156/322
[58] Field of Search ............... 136/244, 251; 156/300, 156/301, 308.2, 309.9, 322; 29/572

[56] References Cited

U.S. PATENT DOCUMENTS

| | | | |
|---|---|---|---|
| 3,957,537 | 5/1976 | Baskett et al. | 136/251 |
| 4,009,054 | 2/1977 | Gochermann et al. | 136/251 |
| 4,116,207 | 9/1978 | Dominguez | 136/251 |
| 4,149,665 | 4/1979 | Costogue et al. | 228/5.1 |
| 4,184,903 | 1/1980 | Dillard et al. | 156/204 |

*Primary Examiner*—Aaron Weisstuch
*Attorney, Agent, or Firm*—Joseph J. Dvorak

[57] ABSTRACT

An assembly comprising a plurality of solar cells arrayed on and adhesively bonded to a sheet of nonwoven heat-actuatable fabric is provided which offers significant advantages in the fabrication of solar cell panels, particularly fabrication of panels by vacuum lamination techniques.

5 Claims, 4 Drawing Figures

SOLAR CELL ASSEMBLY AND FABRICATION OF SOLAR CELL PANELS UTILIZING SAME

FIELD OF THE INVENTION

This invention relates generally to a solar cell assembly particularly useful in the fabrication of solar cell panels.

BACKGROUND OF THE INVENTION

In general, a solar cell panel consists of individual solar cells electrically interconnected and housed in a protective and supporting enclosure.

Typically, the individual solar cells of the module are arranged in columns and rows and are interconnected by interconnector means which are positioned so as to connect the cells in the requisite series and/or parallel circuit arrangement. The circuit arrangement, of course, depends upon the desired output voltage and current at the panel peak power point.

A protective enclosure or housing is used in order to protect the solar cells and the interconnector means from degrading as a result of environmental conditions such as humidity, pollutants, wind, snow, ice damage and the like. Typically, the housing consists of a rigid support structure on which solar cells are mounted and a top light transparent silicone encapsulant through which solar radiation passes before impinging upon the active solar cells. Generally a protective glass cover sheet is applied over the encapsulant. More recently, there has been a tendency to mount an array of solar cells to the bottom surface of an optically clear superstrate not only to protect the solar cell array against environmental hazards, but also to serve as the structural support for the solar cell array. The arrayed and so mounted cells also are encapsulated in a protective encapsulant at least on the underside thereof.

In encapsulating solar cell arrays, one of two major methods typically is employed. In one method, a liquid encapsulant is poured into a mold or pumped into a cavity where it is cured. In a second method, sheets of encapsulant material are layed up with a solar cell array into an assembly which then is vacuum laminated under appropriate temperature conditions resulting in the fusing of the encapsulant into a single optically clear layer which encompasses the solar cell array and which layer also is bonded to any support material that is employed in forming the solar cell panel. In either technique, it is particularly important to assure that the encapsulant is free of air bubbles since panel defects such as delamination and cell cracking often are associated with bubbles present in the encapsulant.

As will be appreciated, bubble formation in the encapsulant is more prevalent when solar panels are fabricated by the vacuum lamination method and numerous techniques have been devised in an attempt to provide for complete removal of air prior to the lamination of the sheets of encapsulant. For example, fiberglass scrim and similar sheets of woven fabrics frequently are used in vacuum lamination processes to hold the sheets of encapsulant apart during the evacuation step and prior to the fusing of the sheets of encapsulant.

Another problem in fabricating solar cell panels is to assure precise alignment of the individual solar cells in the array. One standard technique for forming a panel begins with arranging individual solar cells in the appropriate rows and columns on an appropriate alignment or spacing jig. Next the metallic interconnectors are attached to the cell electrodes by soldering or welding. In typical solar cells, the interconnector extends from the top electrode of one cell to the bottom electrode of the next adjacent cell. Rows of adjacent cells, of course, are similarly connected. Consequently, there is a lot of handling and movement of individual cells in order to properly index or position the cells and complete the soldering and welding. This technique is described, for example, in U.S. Pat. No. 4,132,570.

In U.S. Pat. No. 3,565,719, a method of forming a solar panel is disclosed in which the cells are arranged in a pre-alignment fixture having cavities therein, and the so-arrayed cells are thereafter bonded to a support structure and the pre-alignment fixture is removed.

In U.S. Pat. No. 3,780,424, a process for making a solar panel is described in which an adhesive material is used to bond cells in permanent alignment to a substrate.

In U.S. Pat. No. 4,154,998, yet another technique is disclosed for preparing a solar cell panel in which induction heating is used to fuse a plurality of silicon solar cells to their interconnectors and substrate.

Notwithstanding the foregoing advantages, there remains a need for a simple, inexpensive technique for precisely aligning a plurality of silicon solar cells in an array which can be handled easily and used in numerous different types of solar panel structures rather than being limited, for example, to panels having superstrates or panels having substrates.

SUMMARY OF THE INVENTION

In its simplest sense, the present invention comprises a sheet of non-woven, thermoplastic, heat-actuatable fabric having a plurality of solar cells arrayed on and adhesively bonded to the top surface of the sheet material.

The assembly is readily prepared by placing a sheet of non-woven, thermoplastic, heat-actuatable fabric on a work surface over a diagram of the desired cell layout. The sheet material is sufficiently thin and the openings between the fibers sufficiently wide that at least portions of the diagram below the sheet are visible, thereby permitting proper location of solar cells on the sheet. The individual solar cells, each having an interconnector attached to the bottom of the cell, are placed in their appropriate position on the sheet material in accordance with the cell layout. Then the cells are interconnected by soldering. Since the sheet material is heat actuatable, as the solar cells are soldered, the cell and the interconnector have their temperature raised sufficiently so that the sheet material fuses to the cell, thereby adhesively bonding the cell in a fixed position on the sheet. Thereafter the assembly can be used in preparing a solar cell panel.

These and other embodiments of the invention are described with particularity in the detailed description.

DETAILED DESCRIPTION OF THE INVENTION

Figure 1:
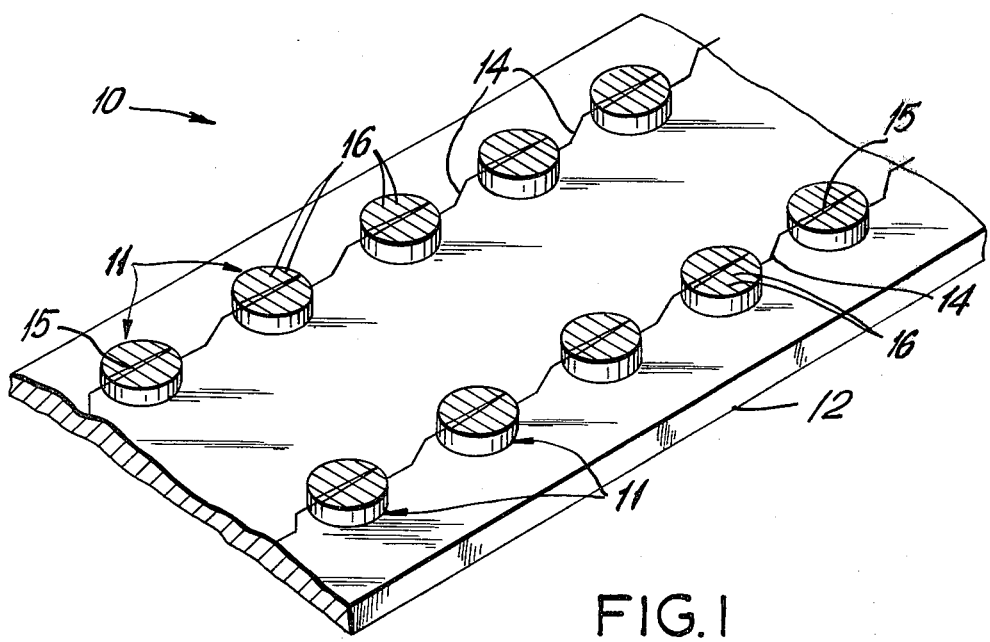
FIG. 1 is a perspective fragmentary view of a solar cell assembly in accordance with the present invention.

Referring to FIG. 1, a solar cell assembly 10 in accordance with the present invention is shown in a fragmentary perspective view. As can be seen, the solar cell assembly 10 includes a plurality of solar cells 11 arrayed upon and adhesively bonded to the top surface of a non-woven, heat-actuatable sheet material 12. Preferably the sheet material 12 will be of the same general dimensions of any solar cell panel which is to be formed from the solar cell assembly 10. The cells are provided with metal interconnectors 14. The interconnectors are attached to the cells, for example by soldering or welding, to provide the desired series and/or parallel arrangement for the array. As can be seen, the cells have a bus bar 15 and current collectors 16 on the top surface of the cell. The interconnectors 14 connect the bus bar on the top surface of one cell to the electrode (not visible) on the bottom surface of an adjacent cell.

In forming the solar cell assembly of FIG. 1, the heat actuatable sheet material 12 of the requisite size is placed over a diagram 17 of the desired cell layout. The heat-actuatable sheet material suitable in the practice of the present invention preferably is sufficiently transparent when placed in contact with the cell layout diagram so that the desired position of the cells can be seen through the sheet material 12. Additionally, the sheet material preferably is thermally actuatable at temperatures generally in the range of about 90° C. to about 150° C., although sheet material which is thermally actuatable at lower temperatures may be employed. In general, the heat-actuatable sheet material is formed from synthetic fibers such as polyester, polyamide and acrylic fibers which have a heat-actuatable adhesive on the surface thereof or the sheet material is formed from fibers or filaments of thermoplastic adhesive material. Such heat-actuatable sheet material is commercially available. Indeed, the commercially available heat-actuatable sheet materials are generally white in appearance and consequently, in an alternate embodiment of the present invention, the cell layout diagram is printed on the sheet material 12.

After placing the sheet material 12 over the cell layout (or providing a sheet material with the cell diagram printed thereon), the individual cells are aligned in their proper position on top of the sheet material in accordance with the cell layout diagram 17. Since the non-woven sheet material has a slightly rough surface which will tend to grab any of the defects or roughness on the bottom of the solar cell placed upon it, the cells do not slide around or move about once they are placed in position on the surface of the sheet layer material 12.

Figure 2:
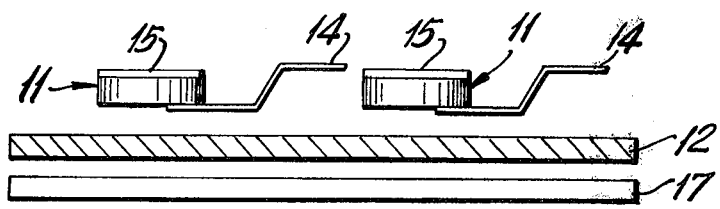
FIG. 2 is a schematic illustration of the technique of forming the assembly of the present invention.

Additionally, as can be noted in FIG. 2, the individual solar cells 11 each have one end of the metal interconnector 14 soldered to the bottom electrode on solar cell 11. Consequently, the next step in preparing the solar cell assembly of the present invention is to solder the interconnector 14 of one cell to the top electrode or bus bar 15 of the next adjacent cell. During the soldering process, a portion of each cell being soldered gets sufficiently hot to cause the surface of sheet material 12 to fuse and adhere to the bottom of the solar cell. Consequently, each of the solar cells after they have been soldered to the next adjacent cell becomes permanently fixed in the position on the sheet material 12. After the cells are soldered one to the other, the entire assembly can be lifted and moved about and washed and dried just by picking it up at one of the ends of the sheet material.

Figure 3:
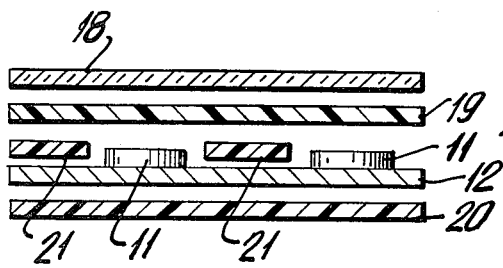
FIG. 3 is a schematic illustration of the arrangement of components utilizing the assembly of the present invention in a solar cell panel.

Referring now to FIG. 3, a solar panel utilizing the solar cell assembly 10 of the present invention is fabricated by preparing a laminate including the support for the solar cell array. In the embodiment shown in FIG. 3, the support is a superstrate 18 made of a light transparent rigid sheet material such as glass. In order to bond the solar cell assembly 10 to the top support structure, a sheet of clear light transparent thermoplastic film 19 is interposed between the superstrate 18 and the solar cell assembly 10. Standard light transparent thermoplastic film materials used in the fabrication of solar cell panels can be employed in this invention. Thus, sheets of polyethylene vinylacetate or polyvinylbutyrate are eminently suitable in the practice of the present invention. In the laminate shown in FIG. 3, a backing sheet of thermoplastic film material 20 is also provided so as to provide a protective back layer for the solar cells against exposure to the environmental atmosphere and hazards. Following the normal vacuum bag processing techniques, the assembly is placed in a vacuum bag and the bag evacuated under heat, thereby resulting in the requisite pressure to fuse the various components of the laminate into a panel structure.

Included in the assembly as shown in FIG. 3 are strips of non-woven thermoplastic material 21 which are arranged linearly in the longitudinal alleys between the rows of individual solar cells. One of the advantages of placing such a non-woven sheet material in the longitudinal alleyways between the rows of individual solar cells is to permit adequate evacuation of the laminate prior to complete fusion of the thermoplastic material. Hence, air bubbles and the like are avoided, thereby enhancing the quality of the panel made with the solar assembly 10.

Figure 4:
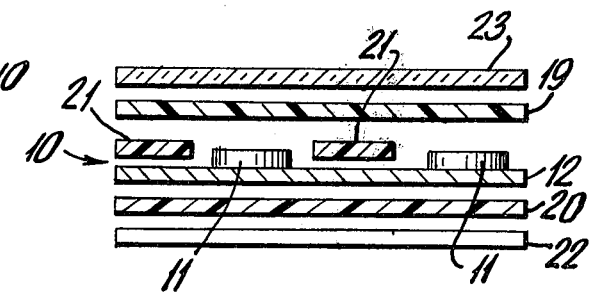
FIG. 4 is yet another schematic illustration of the arrangement of various components used in the fabrication of a solar cell panel utilizing the assembly of the present invention.

Optionally a bottom layer of white sheet material (not shown) can also be applied to the assembly so that light which is incident on the areas between the individual solar cells will be scattered by the white diffusive surface and reflected upwardly to the top of the panel and internally reflected downwardly to the top of the individual solar cells (a similar laminate is shown in FIG. 4 with the exception that the rigid support structure 22 is provided for supporting the solar cells in the panel). This rigid support structure can be a white polyester material similar to that disclosed and claimed, for example, in U.S. Pat. No. 4,132,570. In this embodiment, then, there is shown the cell supported on substrate 22. Nonetheless, a top glass cover 23 is provided in order to protect the cells against environmental hazards resulting from wind, rain, hail, etc. The top protective cover typically will be glass; however, it need not be of the same strength as the glass layer 18 of the embodiment shown in FIG. 3.

Among the advantages of the assembly of the present invention is that (1) individual solar cells may be strung in an appropriate array and the array moved without the need for expensive fixtures; (2) because the cells do not readily move when placed on the surface of the heat fusible sheet material, they can be strung in a very close spaced pattern; (3) after bonding the array of cells on the top surface of the sheet material, the cells can be easily washed and hung to dry, thereby facilitating the removal of the flux used in soldering the cells; (4) cell spacing is maintained through the laminating process;

and (5) the entire assembly can be primed, for example, by dipping the entire array thus insuring perfect coverage of all the elements of the assembly. These and other advantages should be readily apparent although no intention is made to be limited to the specific embodiments outlined in the detailed description; but, rather, it is intended that many other changes and modifications may also be made without departing from the spirit and scope of the invention as set forth herein.

What is claimed is:

1. A solar cell assembly for use in forming a solar cell panel comprising: a sheet of non-woven, heat-actuatable sheet material selected from the group consisting of non-woven synthetic fibers having a thermally activated adhesive thereon and non-woven filaments of thermoplastic adhesive material, said sheet material having a major top surface; and a plurality of solar cells arrayed on and adhesively bonded to the top surface of the sheet material.

2. In the method of forming a solar cell panel by laminating an array of solar cells between protective sheet material, the improvement comprising:

forming a solar cell assembly by providing a sheet of non-woven, heat-actuatable sheet material having a major top surface;

placing a plurality of solar cells on the top of said sheet in a predetermined pattern, said cells having interconnectors bonded to the bottom electrode of said cells;

attaching the interconnector of one cell to the top electrode of an adjacent cell by soldering or welding whereby said cells are electrically interconnected and whereby at least a portion of said cells becomes sufficiently heated to activate said heat-actuatable sheet material and become adhesively bonded thereto, thereby providing a solar cell assembly; and thereafter laminating said assembly between protective sheet material to provide a solar cell panel.

3. The method of claim 2 including placing the sheet of heat-actuatable sheet material over a cell layout diagram defining a predetermined pattern and wherein said heat-actuatable sheet material is sufficiently transparent that when it is placed in contact with said diagram at least a portion of the diagram can be seen through the sheet material.

4. The method of claim 2 wherein said heat-actuatable material is thermally activated at temperatures in the range of from about 90° C. to about 150° C.

5. The method of claim 2 wherein said heat-actuatable sheet material is selected from the group consisting of synthetic fibers having a thermally activated adhesive thereon and non-woven filaments of thermoplastic adhesive material.

* * * * *